United States Patent
Huang

(10) Patent No.: US 7,166,876 B2
(45) Date of Patent: Jan. 23, 2007

(54) MOSFET WITH ELECTROSTATIC DISCHARGE PROTECTION STRUCTURE AND METHOD OF FABRICATION

(75) Inventor: Shao-Chang Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/833,773

(22) Filed: Apr. 28, 2004

(65) Prior Publication Data

US 2005/0242399 A1 Nov. 3, 2005

(51) Int. Cl.
 *H01L 23/58* (2006.01)
 *H01L 21/8234* (2006.01)

(52) U.S. Cl. ............ 257/213; 257/355; 257/E29.242; 438/237

(58) Field of Classification Search .......... 257/24, 257/65, 141, 213, 355; 438/237
See application file for complete search history.

(56) References Cited

U.S. PATENT DOCUMENTS

| | | | | |
|---|---|---|---|---|
| 5,374,570 A | * | 12/1994 | Nasu et al. | |
| 5,629,900 A | * | 5/1997 | Hirose et al. | |
| 5,895,950 A | * | 4/1999 | Walker et al. | 257/315 |
| 5,918,127 A | | 6/1999 | Lee et al. | |
| 6,034,896 A | * | 3/2000 | Ranaweera et al. | 365/185.28 |
| 6,121,077 A | * | 9/2000 | Hu et al. | |
| 6,194,282 B1 | * | 2/2001 | Niimi et al. | |
| 6,261,935 B1 | * | 7/2001 | See et al. | |
| 6,265,778 B1 | * | 7/2001 | Tuttori | |
| 6,271,070 B1 | * | 8/2001 | Kotani et al. | |
| 6,307,791 B1 | * | 10/2001 | Otsuka et al. | 365/189.05 |
| 6,323,522 B1 | * | 11/2001 | Hargrove et al. | 257/347 |
| 6,444,511 B1 | | 9/2002 | Wu et al. | |
| 6,466,082 B1 | * | 10/2002 | Krishnan | |
| 6,479,883 B1 | * | 11/2002 | Chen et al. | 257/546 |
| 6,657,223 B1 | * | 12/2003 | Wang et al. | |
| 2004/0219760 A1 | * | 11/2004 | Chaine et al. | 438/400 |
| 2005/0088801 A1 | * | 4/2005 | Shih et al. | 361/306.2 |

\* cited by examiner

*Primary Examiner*—Evan Pert
(74) *Attorney, Agent, or Firm*—Haynes and Boone, LLP

(57) ABSTRACT

A semiconductor circuit comprises a semiconductor substrate, a semiconductor device having a drain region disposed in the substrate, and a reverse doped region laterally adjacent and laterally contacting the drain region wherein the reverse doped region has an opposite doping type from that of the drain region and a dopant concentration higher than that of the semiconductor substrate, the reverse doped region and the drain forming a p-n junction.

44 Claims, 12 Drawing Sheets

US 7,166,876 B2

MOSFET WITH ELECTROSTATIC DISCHARGE PROTECTION STRUCTURE AND METHOD OF FABRICATION

BACKGROUND

A semiconductor integrated circuit (IC) connected to external ports is susceptible to electrostatic discharge damage from the operating environment. Electrostatic discharge occurs when electrical charge is rapidly transferred between one or more pins of the integrated circuit and an external object. The scaling-down of integrated circuits further increases the possibility of circuit damage from electrostatic discharges. Electrostatic discharge protection circuits may be used to shunt the electrostatic energy to protect sensitive core integrated circuits.

However, currently available electrostatic discharge protection circuits are either not robust enough to protect sensitive core circuits with smaller pattern feature size, require extra processing, or are not cost-effective.

BRIEF DESCRIPTION OF THE DRAWINGS

The present disclosure is best understood from the following detailed description when read with the accompanying figures. It is emphasized that, in accordance with the standard practice in the industry, various features are not drawn to the scale. In fact, the dimensions of the various features may be arbitrarily increased or reduced for clarity of discussion.

FIG. 1b is a plan view of the exemplary embodiment of the electrostatic discharge protection structure of FIG. 1a.

DETAILED DESCRIPTION

Figure 1A:
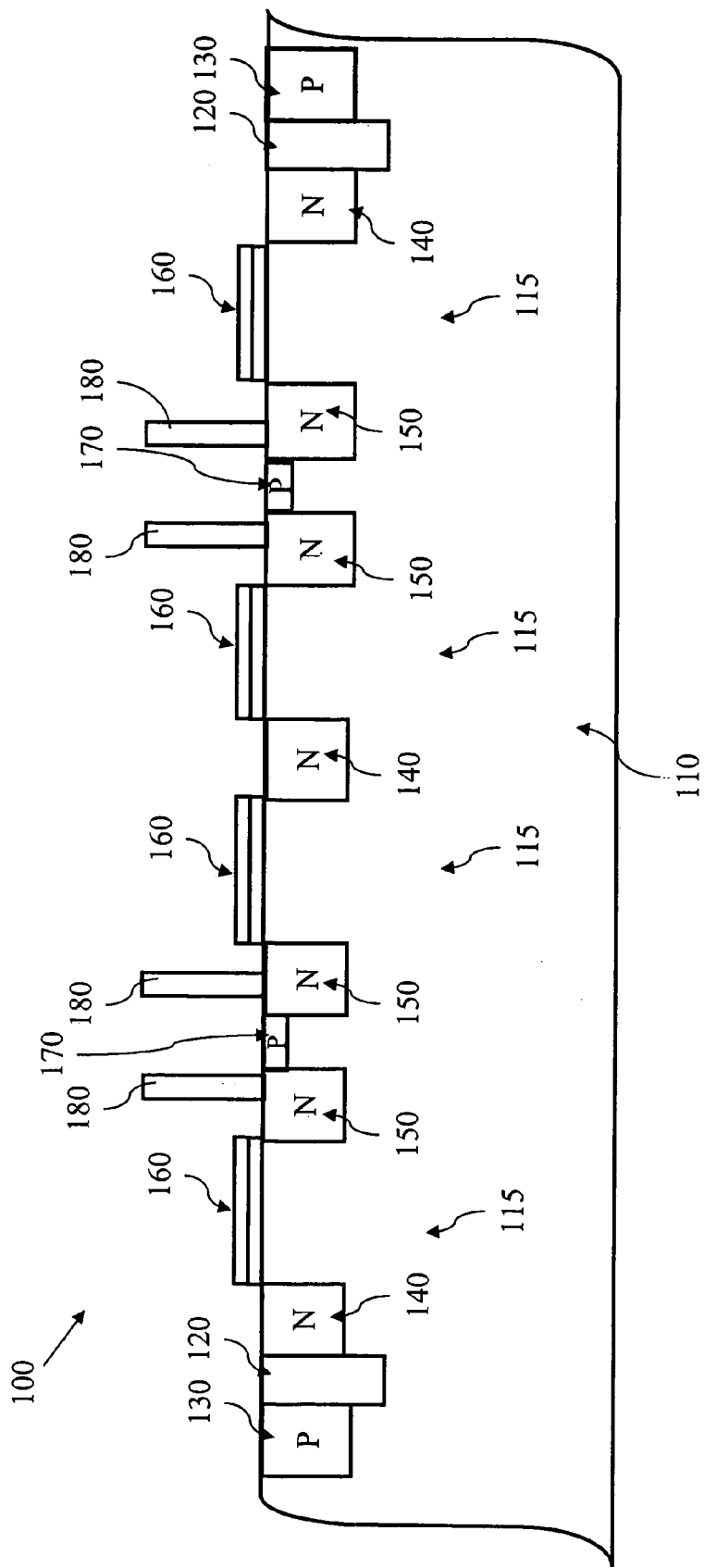
FIG. 1a is a schematic diagram of one exemplary embodiment of an electrostatic discharge protection structure constructed according to aspects of the present disclosure.

The present disclosure relates generally to the field of semiconductor integrated circuits, more particularly, to electrostatic discharge (ESD) protection circuits.

It is understood that the following disclosure provides many different embodiments or examples for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1B:
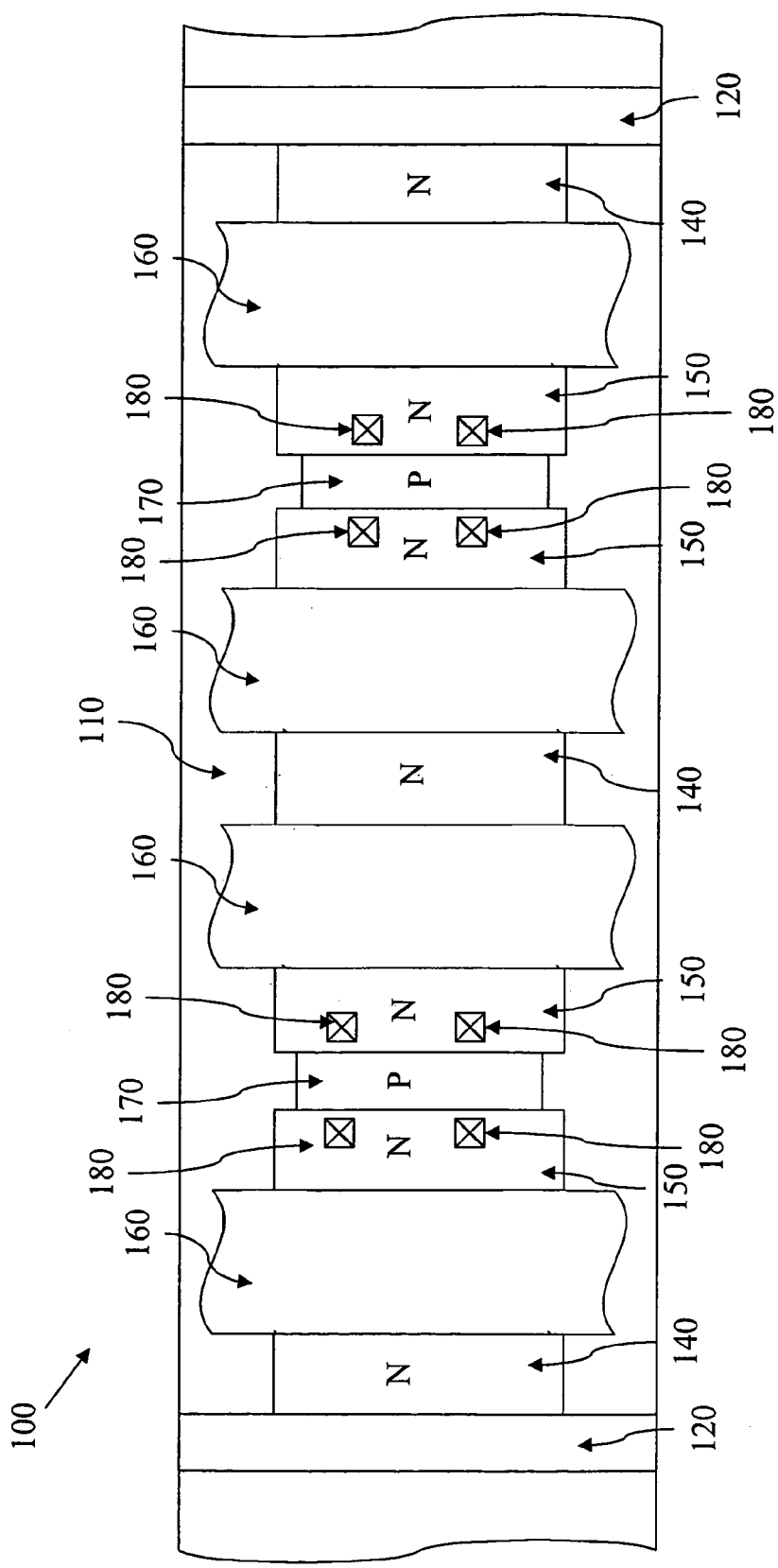

FIG. 1a is a schematic diagram of one exemplary embodiment of an electrostatic discharge protection structure 100. FIG. 1b is a plan view of the exemplary embodiment of the electrostatic discharge protection structure 100. The structure 100 includes a semiconductor substrate 110 and at least one n-type metal oxide semiconductor field effect transistor (NMOSFETs or NMOS) 115 formed in the substrate 110. The substrate 110 may be a portion of a p-type doped substrate or a p-well over a n-type substrate. Isolation structures 120 are disposed in the substrate 110 to separate the NMOS 115 from one another. The isolation regions 120 may be formed using local oxidation of silicon (LOCOS), shallow trench isolation (STI), or other suitable methods. The structure 100 may further include p-type doped regions 130 that may function as a pickup for substrate bias. The NMOS transistors 115 may each include a source region ("source") 140, a drain region ("drain") 150, and a gate stack ("gate") 160 interposed between the source 140 and the drain 150. The gate stack 160 further includes a gate dielectric and gate electrode. Furthermore, the NMOS transistor 115 includes a reverse type doped region 170 laterally disposed in the drain region 150 and drain contacts 180. The drain 150 may be coupled to an input/output pad through contacts 180 when the NMOS transistor 115 is used as a part of an input/output interface device.

For enhanced electrostatic discharge protection, NMOS 115 includes the p-type doped regions ("reverse doped") 170 formed laterally adjacent to the drain region 150. Therefore, a p-n junction is formed wherein the reverse doped region 170 may have a higher dopant concentration than that of the substrate 110. For example, the dopant concentration per unit area of the reverse doped region may be on the order of about $10^{13}$ cm$^{-2}$ compared with the dopant concentration per unit area of the drain region 150 on the order of about $10^{15}$ cm$^{-2}$. The upper surface of the reverse doped region 170 may be substantially coplanar with that of the drain region 150. The p-n junction formed by the reverse doped region 170 and the drain 150 provides a lower reverse breakdown voltage of the p-n junction than that of a p-n junction between the drain 150 and the substrate 110. In this manner, electrostatic discharge protection is enhanced.

The reverse doped region 170 may be formed by a doping process including conventional implantation methods known in the art. The reverse doped region 170 may be formed simultaneously with other p-type doped regions. For example, the reverse doped region 170 in the NMOS transistor 115 may be formed simultaneously with the source/drain or lightly-doped drain (LLD) of PMOS transistors by a same implantation process. Therefore, no additional photomask and implantation steps are required to form the reverse doped region 170.

The NMOS transistors 115 includes source regions 140 and drain regions 150 formed within or over the semiconductor substrate, in which the source and drain may be formed directly in a p-type substrate, in a p-well structure, over a silicon germanium layer, or a silicon carbide layer, or in a raised structure. The source and drain may have a complicated doping profile for enhanced performance implemented by a multiple implantation processing. For example, the source and drain may include light doped drain (LLD) region formed by light-dose implantation and source/ drain (S/D) doped region formed by heavy-dose implantation. The NMOS 115 may have a FinFET structure, a double gate structure, or a multi-finger structure.

Figure 2:
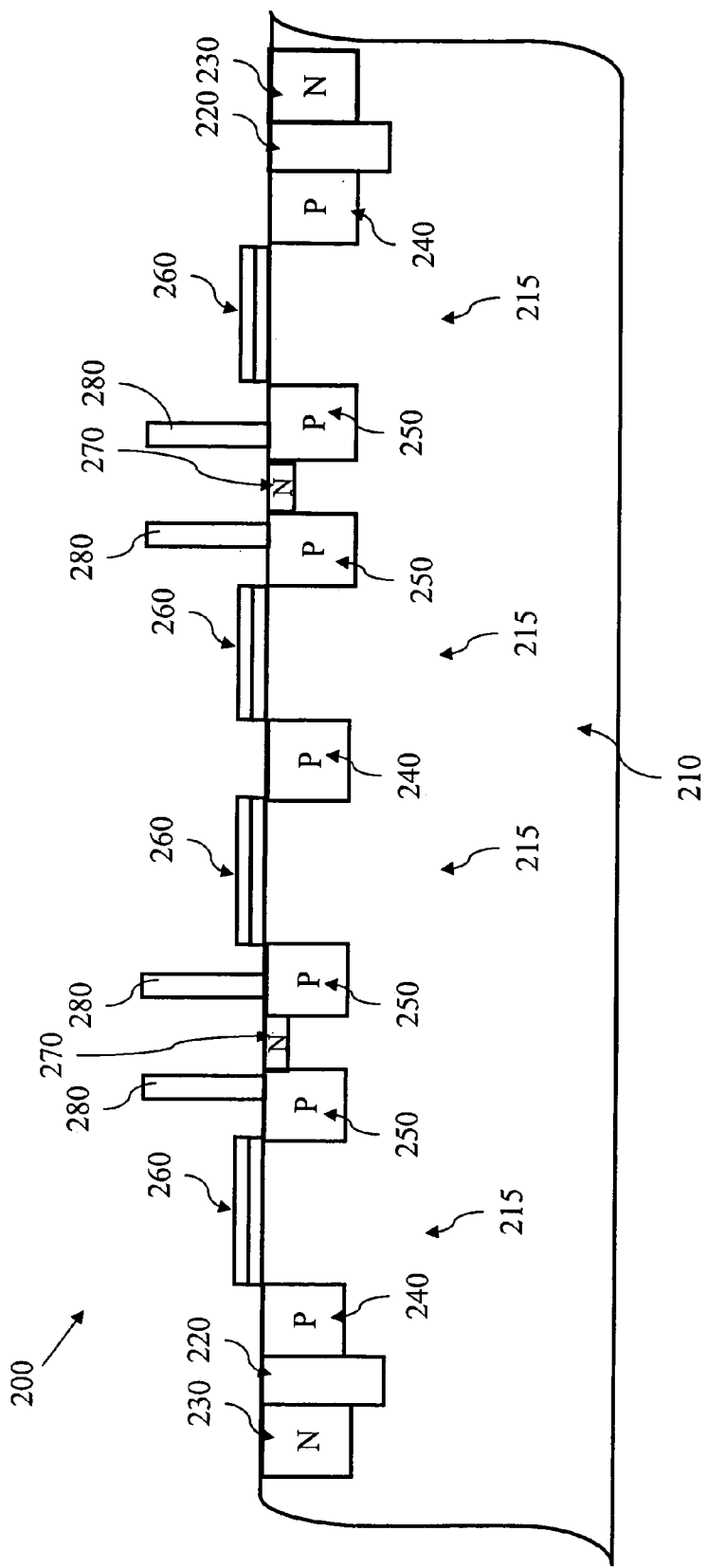
FIG. 2 is a schematic diagram of another exemplary embodiment of an electrostatic discharge protection structure constructed according to aspects of the present disclosure.

FIG. 2 is a schematic diagram of another exemplary embodiment of an electrostatic discharge protection structure 200. The protection structure 200 includes a semiconductor substrate 210, positive metal oxide semiconductor field effect transistors (PMOSFETs or PMOS) 215 formed in the substrate 210, and isolation structures 220. The protection structure 200 may further include n-typed doped regions 230. The PMOS transistors 215 each includes a source region ("source") 240, a drain region ("drain") 250, and a gate stack ("gate") 260 interposed between the source 240 and the drain 250. Furthermore, the PMOS transistor 215 includes a reverse type doped region 270. The PMOS 215 may also include drains contacts 280. It is understood that other components and/or layers may be present, but are not shown for purposes of clarity.

The substrate 210 of FIG. 2 may be a portion of an n-type doped substrate or an n-well over a p-type substrate. Further, the PMOS 215 may be fabricated using a P-well, or a dual-well structure, and may be fabricated directly onto or within the semiconductor substrate. In the present example, there is an isolation region 220 to isolate the PMOS 215 from device in the substrate. The isolation region may utilize isolation technology, such as local oxidation of silicon (LOCOS) and shallow trench isolation (STI). The substrate may further include n-type doped regions 230 with functions including as a pickup for substrate bias.

The PMOS transistors 215 may be used in an input/output interface circuit for enhanced electrostatic discharge protection. The PMOS transistor 215 may have a FinFET structure, and may have a strained channel having enhanced carrier mobility.

In PMOS transistors 215, the source 240, the drain 250, and the gate stack 260 interposed between the source and the drain may comprise substantially similar materials and structures used in the NMOS transistors 115 except the doping type is opposite. In one example, different metal silicide from those used in NMOS transistors, for contact areas, may be used for optimized work function and device performance. In one example, the silicide layer may be eliminated in the drain area while the PMOS transistors are used for input/output interface devices. The drain 250 may be directly connected to an input/output pad through contacts 280 when the PMOS transistor 215 is used as a part of an input/output interface device.

Furthermore, according to the present disclosure, n-type doped regions ("reverse doped") 270 are formed laterally adjacent to the drain region 250 of the PMOS transistor 215 to form a p-n junction wherein the reverse doping 270 may have a higher doping concentration than that of the substrate 210. In another embodiment, the reverse doped region laterally interposes between two drain regions. The upper surface of the reverse doped region may be further substantially coplanar with that of the drain region. The p-n junction formed by the reverse doped region and the drain provides a lower reverse breakdown voltage of the p-n junction than that of a p-n junction between the drain 250 and the substrate 210 and electrostatic discharge protection is enhanced. The reverse doped region 270 may be formed by a suitable doping process including conventional implantation known in the art. The reverse doped region 270 may be formed simultaneously with other n-type doped region. For example, the reverse doped region 270 in the PMOS transistor 215 can be formed simultaneously with source/drain doping or LLD doping of NMOS transistors by the same implantation process. No additional photomask or implantation process is required to form the reverse doped region.

Figure 3:
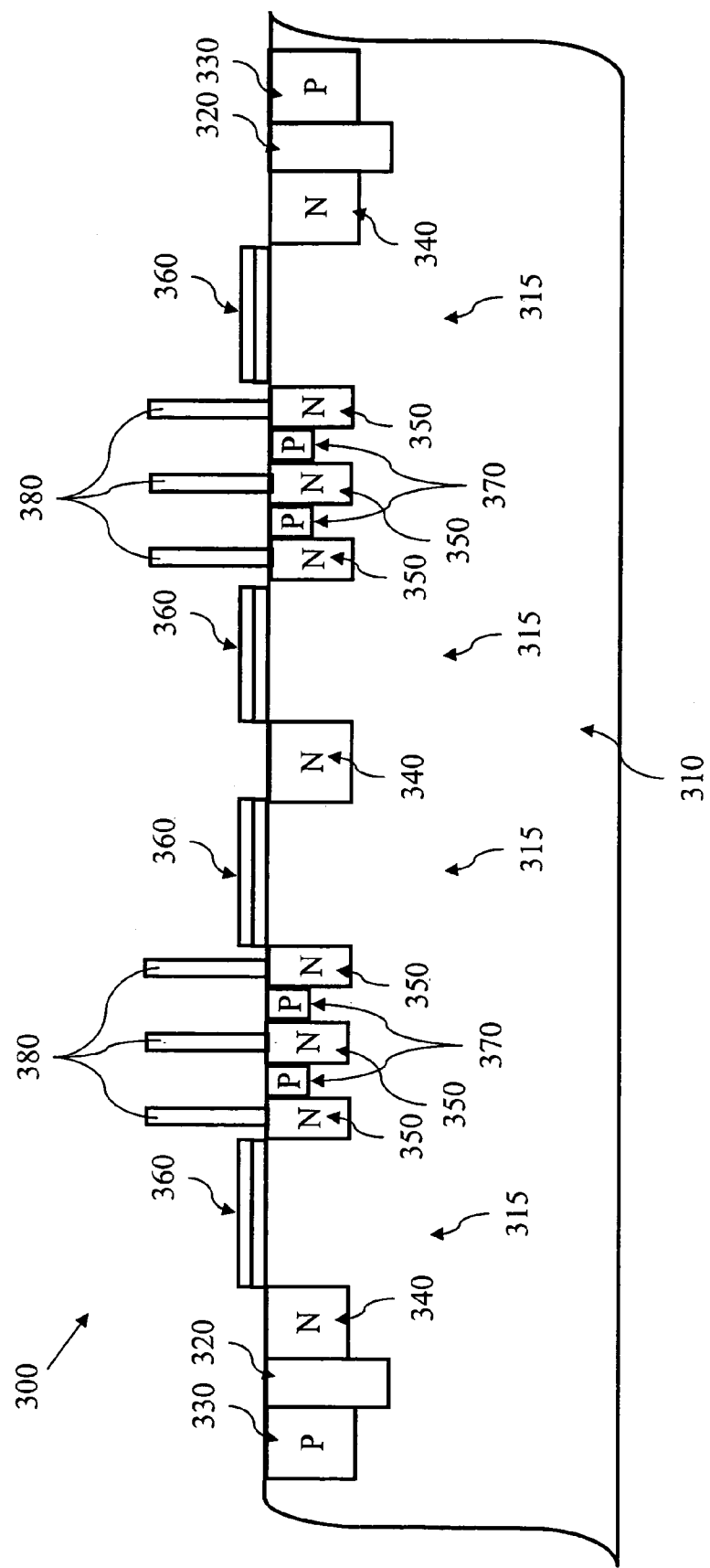
FIG. 3 is a schematic diagram of yet another exemplary embodiment of an electrostatic discharge protection structure constructed according to aspects of the present disclosure.

FIG. 3 is a schematic diagram of another exemplary electrostatic discharge protection structure 300. The structure 300 includes a semiconductor substrate 310, NMOS 315 formed in the substrate 310, and isolation structure 320. The structure 300 may further include p doped regions 330. The NMOS transistors 315 may include source regions ("source") 340, drain regions ("drain") 350, and gate stacks ("gate") 360 interposing between the source 340 and the drain 350. Furthermore, the NMOS transistor 315 includes a reverse type doped region 370. The NMOS 315 may also include drains contacts 380. It is understood that other components and/or layers may be present, but are not shown for purposes of clarity.

The structure 300 is substantially same to the structure 100 in FIG. 1 but the reverse doped regions 370 has a multi-element structure. A plurality of reverse p-type elements are disposed in n-type doped drain 350 form p-n junctions wherein the reverse p-type doped regions have a higher doping concentration than that of the substrate. Each reverse p-type doped element is laterally contacting and interposed between two n-type doped drain regions. In one embodiment, between two proximate gate stacks 360, two reverse doped regions 370 alternatively are located among three n-type doped drain regions as illustrated in FIG. 3. Further, contact features are positioned over each n-type doped drain features and are connected to an input/output pad.

Figure 4:
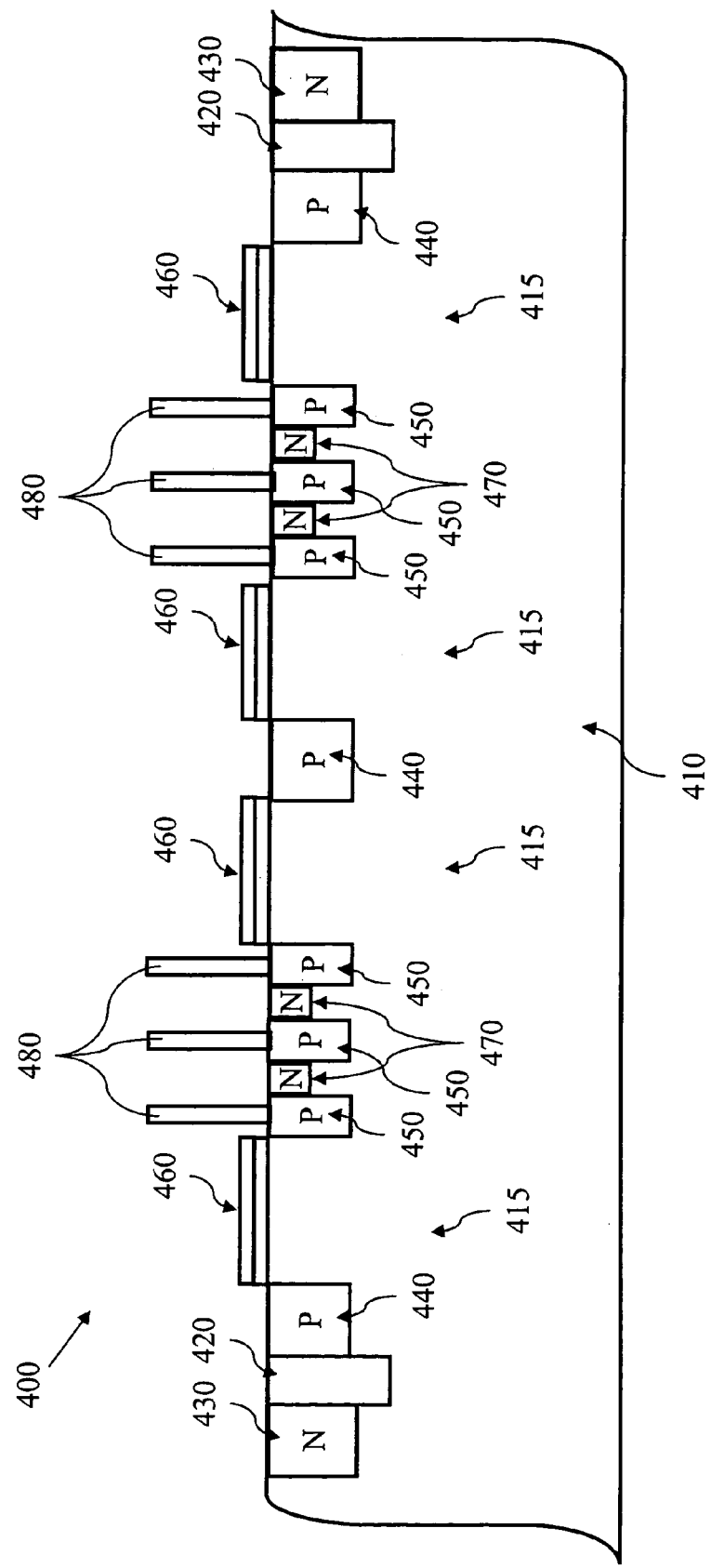
FIG. 4 is a schematic diagram of yet another exemplary embodiment of an electrostatic discharge protection structure constructed according to aspects of the present disclosure.

FIG. 4 is a schematic diagram of another exemplary structure 400 illustrating a particular implementation of electrostatic discharge protection. The structure 400 includes a semiconductor substrate 410, PMOSFETs 415 located in/over the substrate 410, and isolation structure 420. The structure 400 may further include n-type doped regions 430. The PMOS transistors 415 may include source regions ("source") 440, drain regions ("drain") 450, and gate stacks ("gate") 460 interposing between the source 440 and the drain 450. Furthermore, the PMOS transistor 415 includes a reverse type doped region 470. The PMOS 415 may also include drains contacts 480. It is understood that other components and/or layers may be present, but are not shown for purposes of clarity.

The structure 400 has a multi-element structure and is substantially the same as the structure 300 in FIG. 3 but all doping types are opposite. A plurality of reverse n-type doped elements are disposed in the p-type doped drain 450 to form p-n junctions wherein the reverse n-type doped regions have a higher doping concentration than that of the substrate. A reverse n-type doped feature is laterally contacting and interposing two p-type doped features. In one embodiment, between two proximate gate stacks 460, two reverse doped regions 470 alternatively are located among three p doped drain features as illustrated in FIG. 4. Further, contact features are positioned over each p doped drain features and are connected to an input/output pad.

It is understood that the present disclosure provides a new integrated circuit structure wherein each drain feature has at least one reverse doped region laterally adjacent and laterally contacting the drain to form a p-n junction for enhanced electrostatic discharge performance. The devices are not limited to the above-illustrated NMOS transistors as in FIG. 1, PMOS transistors as in FIG. 2, multi-element reverse doped region NMOS transistors in FIG. 3, and multi-element reverse doped region PMOS transistors in FIG. 4. The device may be other devices such as high voltage MOSFETs, FinFET devices, and polymer field effect transistors. The drain may be connected to an input/output pad. Since reverse doped region may be formed simultaneously with other doping processes, the fabrication cost may be reduced.

Figure 5:
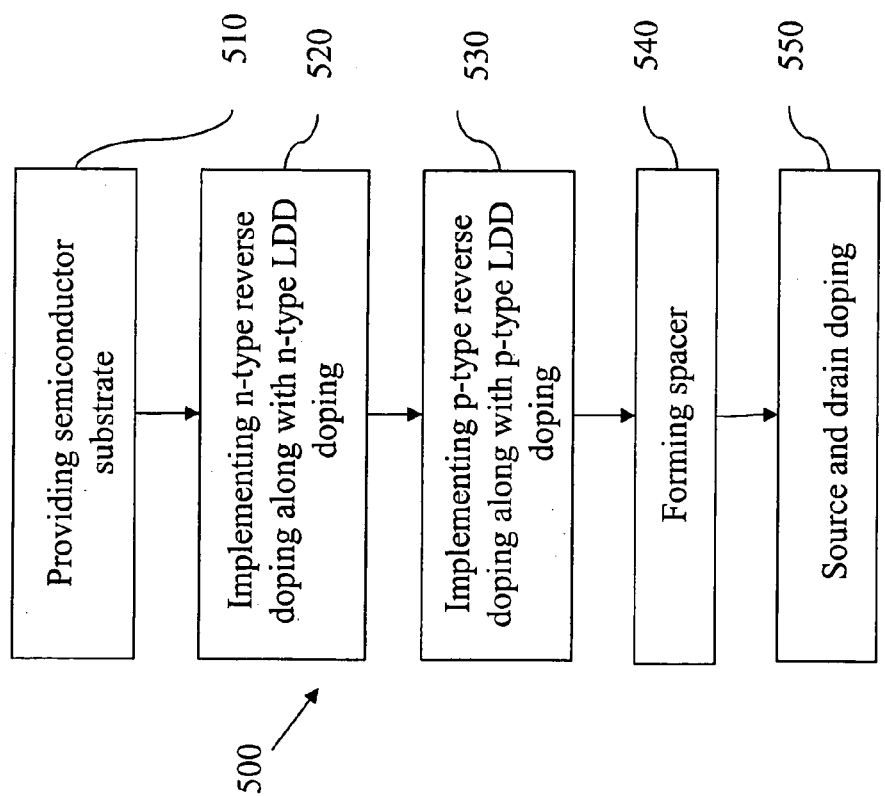
FIG. 5 is a flow chart of one exemplary method for fabricating an electrostatic discharge protection structure constructed according to aspects of the present disclosure.
Figure 6:
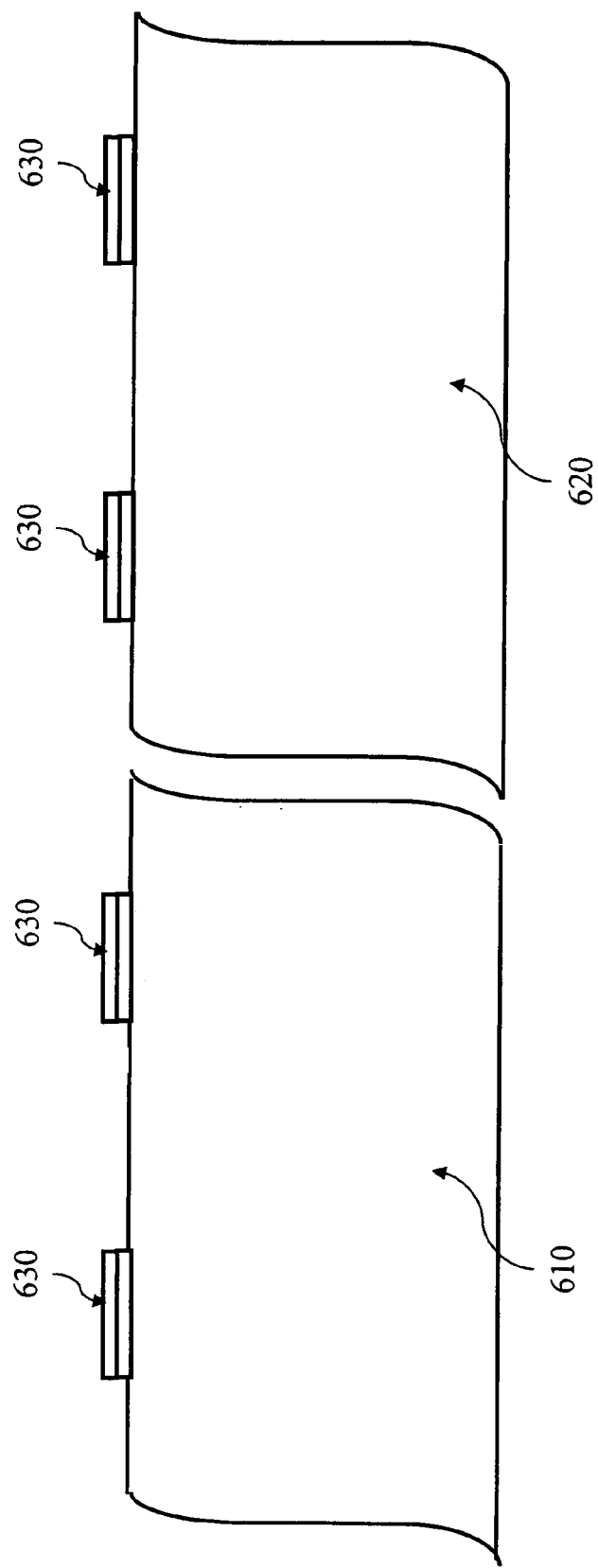
FIGS. 6–10 are cross-sectional views of one exemplary embodiment of an electrostatic discharge protection structure during fabrication using the method of FIG. 5.

FIG. 5 is a flowchart of one embodiment of a method 500 to fabricate an electrostatic discharge protection devices constructed according to aspects of the present disclosure. The method 500 begins at step 510 by providing a semiconductor substrate having devices 610 and 620 as illustrated in FIG. 6. The device 610 may include p-type doped well or a p-type substrate and a gate stack 630 including a gate dielectric and a gate electrode.

The gate dielectric may include a suitable dielectric material or may have a multilayer structure comprising a plurality of dielectric materials. Preferably, the dielectric material may have relatively high integrity and low current leakage. Examples of the dielectric material include silicon oxide, silicon nitride, silicon oxynitride, and a high dielectric constant, k. The high k dielectric may include hafnium oxide, zirconium oxide, aluminum oxide, a hafnium dioxide-alumina (HfO2—Al2O3) alloy, or combinations thereof. Gate dielectric may be formed by thermal oxide, atomic layer deposition (ALD), chemical vapor deposition (CVD), or physical vapor deposition (PVD). The gate dielectric may include additional processes during formation such as nitrogen treatment of thermal oxide layer, and/or annealing of the gate dielectric stack including both silicon oxide and high dielectric constant layer. The gate electrode may include conductive materials and may have multilayer structure.

The gate electrode may be silicon-containing, germanium-containing, other conductive material, and combinations thereof. For example, the conductive material may include doped polycrystalline silicon (poly-Si), poly-SiGe, metal, metal silicide, metal nitride, metal oxide, carbon nanotube, or a combination thereof. The metal may include copper, tungsten, aluminum, aluminum alloy, palladium, titanium, tantalum, nickel, cobalt, and molybdenum. The metal silicide may include copper silicide, tungsten silicide, aluminum silicide, palladium silicide, titanium silicide, tantalum silicide, nickel silicide, cobalt silicide, erbium silicide, and molybdenum silicide. Gate electrode may be formed by CVD, PVD, silicidation, plating, and/or ALD. The gate electrode may include more process during formation such as implant doping for polysilicon, or annealing for silicidation. The gate electrode may have dual structure such as different height of gate for PMOS and NMOS, or/and different materials for NMOS and PMOS.

Figure 7:
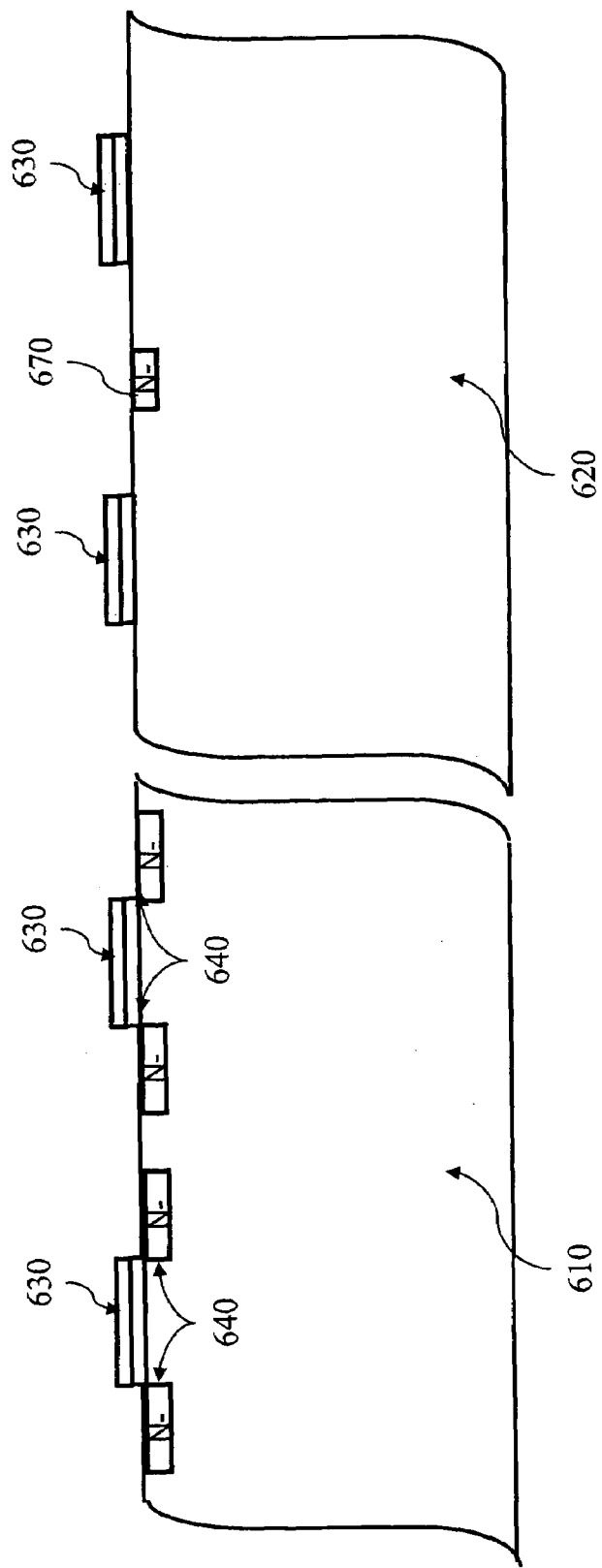

In step 520, with additional reference to FIG. 7 as a cross-sectional view of the device structure during fabrication at step 520. N-type LDD doped regions 640 are implemented by a conventional doping process including ion implantation and diffusion to from a source and a drain in the device 610. During the same process, a reverse doped feature 670 is simultaneously formed in the device 620 along with the LDD doping region 640. The LDD doping regions 640 and the reverse doped region 670 may be formed by ion implantation. The dopant may be phosphorous, for example. Parameters for ion implantation including dose and implanting energy depend on fabrication technology and integrated circuit technology node. For example, the implant dose may range from about $1\times10^{13}$ to about $8\times10^{14}$ cm$^{-2}$.

Figure 8:
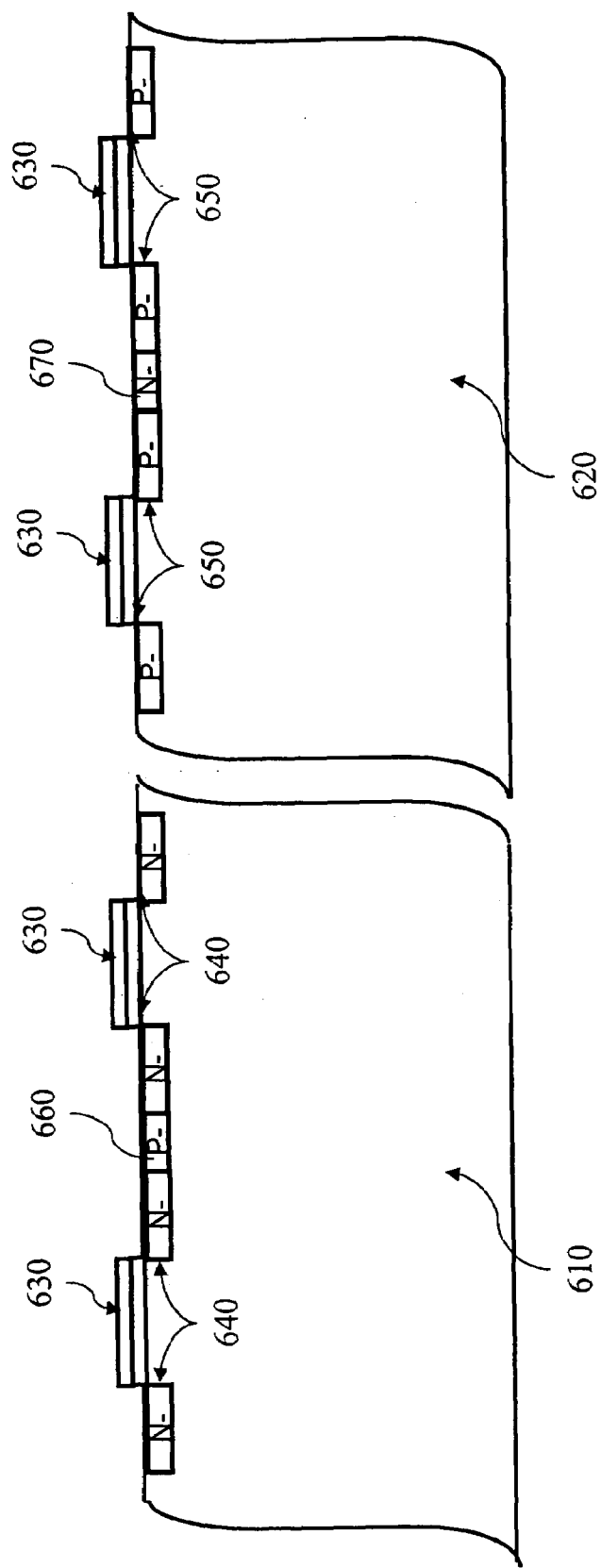

In step 530, with additional reference to FIG. 8 as a cross-sectional view of the device structure during fabrication at step 530, P-type LDD doped regions 650 are implemented by a conventional doping process including ion implantation and diffusion to from a source and a drain in the device 620. During the same process, a reverse doped feature 660 is simultaneously formed in the device 610 along with the LDD doping region 650. The LDD doping regions 650 and the reverse doped region 660 may be formed by ion implantation. The dopant may be Boron, for example. The parameters for ion implantation, including dose and implanting energy, may depend on fabrication technology and integrated circuit technology node. For example, the implant dose may range from about $1\times10^{13}$ to about $8\times10^{14}$ cm$^{-2}$.

Figure 9:
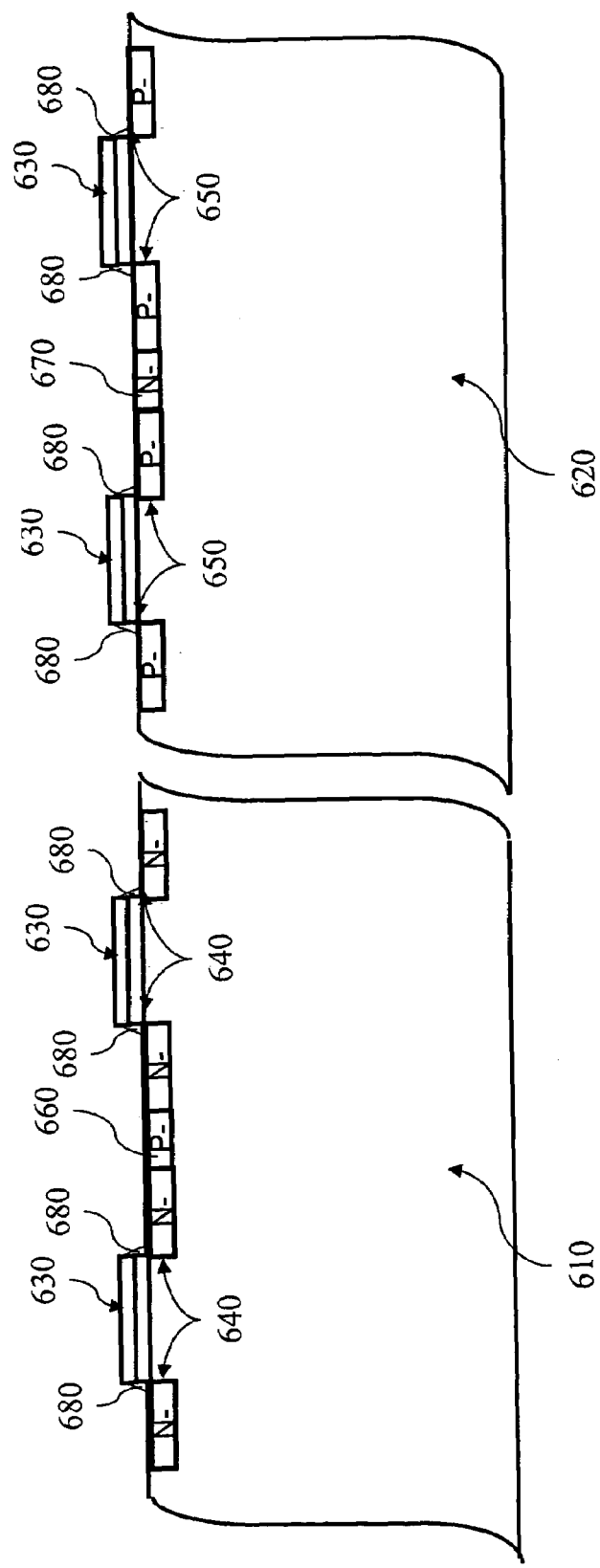

In step 540, with additional reference to FIG. 9 as a cross-sectional view of the device structure during fabrication at step 540, a spacer feature 680 is formed for both the devices 610 and 620. The spacers 680 are positioned on both sides of the gate stack 630, and may comprise a dielectric material such as silicon nitride, silicon oxide, silicon carbide, silicon oxynitride, or combinations thereof. The spacers may have a multiplayer structure. The spacers 680 may be formed by depositing a plurality of insulator material such as silicon oxide, silicon nitride, or/and silicon oxynitride, and then anisotropically etching-back.

Figure 10:
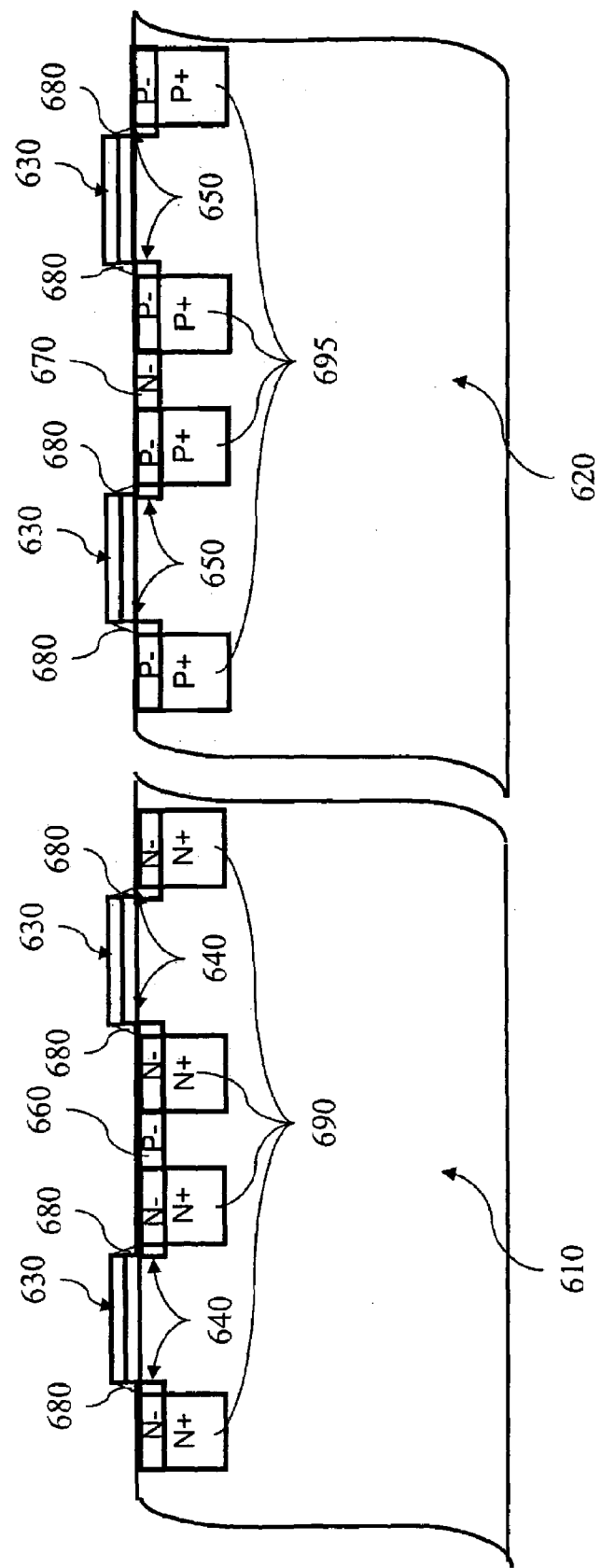

In step 550, with additional reference to FIG. 10 as a cross-sectional view of the device structure during fabrication at step 550, a heavy doped and deeper part of the source and drain regions are formed by ion implantation using heavy dose and high implant energy. N-type heavy doped regions 690 for the device 610 and P-type heavy doped regions 695 for the device 620 may be fabricated in separate processing respectively. For example, the n-type heavy doped regions are formed by phosphorous ion implantation. Then, the p-type heavy doped regions are formed by boron ion implantation. Both implant doses are ranging from about $10^{15}$ to about $10^{16}$ cm$^{-2}$.

The method 500 may include further processes to form contact to connect the gate, source, and the drain. The contact to the drain may be wired to I/O pad through metal interconnection structure. The method 500 may further include to form a stress film overlying and conforming the underlying devices 610 and 620. The method 500 may further include other processes to form multilevel interconnection structure.

The disclosed method described and illustrated through FIG. 5 to FIG. 10 is only an exemplary embodiment. The similar method could be used to from multi-element reverse doped features as illustrated in FIG. 3 and FIG. 4. In another embodiment, the reverse doped regions may be formed along with heavy doped regions by heavy implantation.

Figure 11:
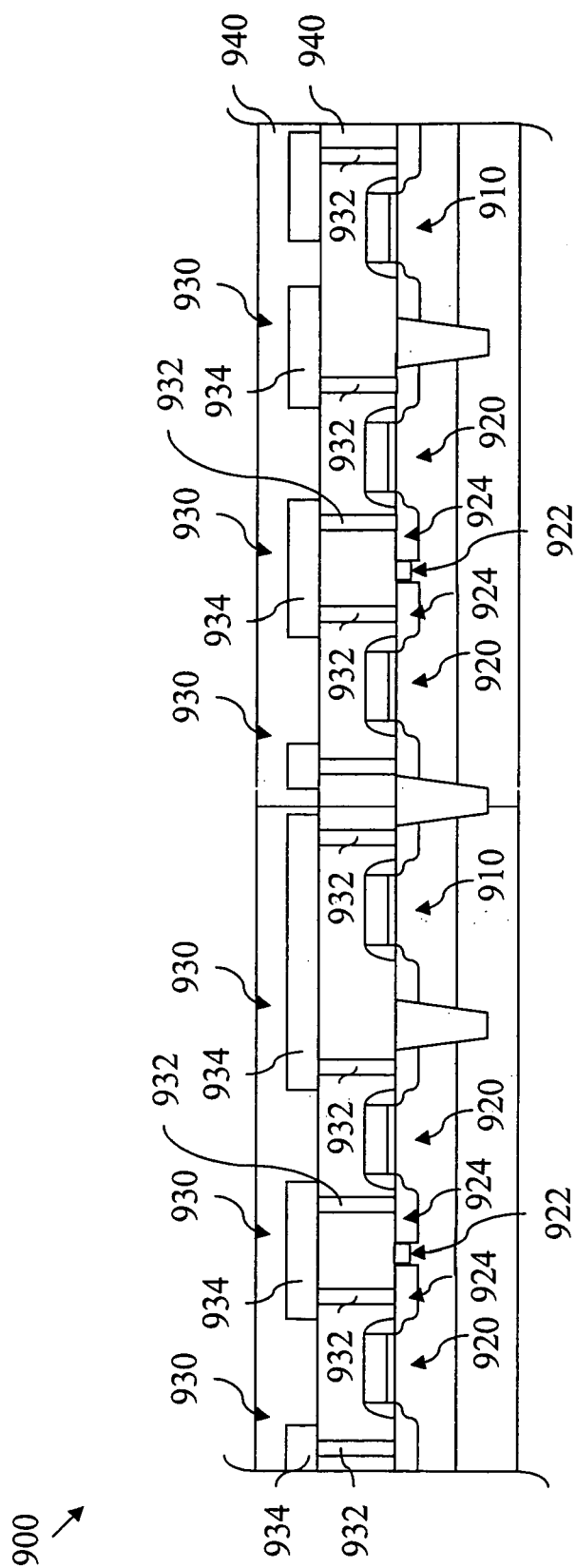
FIG. 11 is a cross-sectional view of one embodiment of an integrated circuit in semiconductor substrate constructed according to aspects of the present disclosure.

FIG. 11 is a cross-sectional view of one embodiment of an integrated circuit 900 in semiconductor substrate constructed according to aspects of the present disclosure. The integrated circuit 900 is one environment in which the NMOS transistor 115 of FIG. 1 and/or the PMOS transistor 215 of FIG. 2 may be implemented. For example, the integrated circuit 900 includes a plurality of NMOS and PMOS transistors 910 and 920, wherein the plurality of devices 920 may be substantially similar to the NMOS transistor 115 of FIG. 1 and/or the PMOS transistor 215 of FIG. 2. The plurality of devices 910 may be used for IC core devices.

The integrated circuit 900 also includes interconnects 930 extending through dielectric layers 940 to ones of the plurality of the transistors 910 and 920. Furthermore, the drains of the transistors 920 may be directly wired to I/O pad. The interconnects 930 may include contacts/via 932 and conductive line 934 employed to interconnect ones of the plurality of MOS transistors 910 and 920, and/or to connect ones of the plurality of MOS transistors 910 and 920 to other devices integral to or discrete from the integrated circuit 900. Materials used to from interconnects include copper, aluminum, aluminum alloy, tungsten, carbon nanotube (CNT), doped polysilicon, titanium silicide, tantalum silicide, other conductive material, or combinations thereof. The interconnects may be formed by PVD, CVD, plating, ALD, and other processing including CMP.

The dielectric layers 940 may comprise silicon oxide, fluorinated silica glass (FSG), low k materials and/or other materials, and may be formed by CVD, spin-on glass (SOG), PVD, ALD and/or other processes including chemical mechanical polishing (CMP). The dielectric layers 940 may each have a thickness ranging between about 500 nm and about 2000 nm, although the dielectric layers 940 are not limited by the scope of the present disclosure to particular thicknesses.

According to the aspects of the present disclosure, each of the transistors 920 may further comprise a reverse doped region 922 which is laterally contacting a drain 924 to form a p-n horizontal junction and the dopant concentration of the reverse doped region 922 is higher than that of the substrate or the well around. The transistor 920 may be an NMOS transistor, or a PMOS transistor. The transistor 920 may be used as a part of I/O circuit for an enhanced electrostatic discharge performance.

The NMOS transistor described herein may have a FinFET structure, and may have a strained channel having enhanced carrier mobility. The NMOS may be fabricated using a P-well, or a dual-well structure, and may be fabricated directly onto or within the semiconductor substrate. The semiconductor substrate described herein may be an elementary semiconductor including silicon or germanium in crystal, polycrystalline, or amorphous structure, or diamond; a compound semiconductor including silicon carbide, gallium arsenic, gallium phosphide, indium phosphide, indium arsenide, and indium antimonide; or an alloy semiconductor including SiGe, GaAsP, AlInAs, AlGaAs, GaInAs, GaInP, and GaInAsP; or a combination thereof. The alloy semiconductor substrate may contain silicon, germanium, carbon, or combinations thereof. In one embodiment, the alloy semiconductor substrate may have gradient SiGe feature in which the Si and Ge composition change from one ratio at one location to another ratio at another location of the gradient SiGe feature. In another embodiment, a crystal silicon layer may formed overlying the alloy SiGe substrate. In another embodiment, a stressed layer is deposited over the transistors wherein the stressed layer may include nitrogen-containing material such as silicon nitride and silicon oxynitride. Furthermore, the semiconductor substrate may be a semiconductor on insulator, such as silicon on insulator (SOI), or a thin film transistor (TFT). The semicondctor substrate may include a buried oxide layer (BOX). In some examples, the semiconductor substrate may include a doped epi layer or a buried layer. In other examples, the semiconductor substrate may have a multilayer structure.

The gate stack of the transistors described above may include a gate dielectric and gate electrode. The gate dielectric may be a suitable dielectric material or may have a multilayer structure comprising a plurality of dielectric materials. Preferably, the dielectric material may have relatively high integrity and low current leakage. Examples of the dielectric material include silicon oxide, silicon nitride, silicon oxynitride, and a high k dielectric. The high k dielectric may include hafnium oxide, zirconium oxide, aluminum oxide, a hafnium dioxide-alumina (HfO2—Al2O3) alloy, or combinations thereof. The gate electrode may include conductive materials and may have multilayer structure. The gate electrode may be silicon-containing, germanium-containing, metal-containing, or combinations thereof. The conductive material may comprise doped polycrystalline silicon (poly-Si), poly-SiGe, metal, metal silicide, metal nitride, metal oxide, carbon nanotube, or a combination thereof. The metal may include copper, tungsten, aluminum, aluminum alloy, palladium, titanium, tantalum, nickel, cobalt, and molybdenum. The metal silicide may include copper silicide, tungsten silicide, aluminum silicide, palladium silicide, titanium silicide, tantalum silicide, nickel silicide, cobalt silicide, erbium silicide, and molybdenum silicide. The gate stack may further include spacers, which are positioned on both sides of the gate dielectric and the gate electrode. The spacers may comprise a dielectric material such as silicon nitride, silicon oxide, silicon carbide, silicon oxynitride, or combinations thereof. It should be noted that the above lists possible materials that may be employed in the electrostatic discharge protection structure but are merely given as examples thereof.

It is understood that other device components and/or layers may be present in FIGS. 1 through 4 but are not shown for the purpose of clarity. Further, it is understood that the reverse doped region is not limited to NMOS structures, but may be used to form other field effect transistors including high voltage devices.

Although embodiments of the present disclosure have been described in detail, those skilled in the art should understand that various changes, substitutions and alterations may be made herein without departing from the spirit and scope of the present disclosure. The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A semiconductor circuit, comprising:
   a semiconductor substrate;
   a semiconductor device having a first drain region and a source region disposed in the semiconductor substrate and having a channel region between the source and first drain regions, wherein the first drain region is coupled to a drain contact;
   a further device having second drain region disposed in the semiconductor substrate; and
   a reverse doped region laterally adjacent and laterally contacting the first drain region on a side of the first drain region opposite from the channel region, and disposed adjacent the second drain region wherein the reverse doped region has an opposite doping type from that of the first and second drain regions, has a dopant concentration higher than that of the semiconductor substrate, and is electrically floating, the reverse doped region and the first drain region forming a p-n junction.

2. The semiconductor circuit of claim 1 further comprising a conductive contact coupled between the first drain region and an input/output pad.

3. The semiconductor circuit of claim 1 wherein the semiconductor substrate comprises materials selected from the group consisting of silicon, germanium, diamond, silicon carbide, gallium arsenic, gallium phosphide, indium phosphide, indium arsenide, and indium antimonide, SiGe, GaAsP, AlInAs, AlGaAs, GaInAs, GaInP, and GaInAsP.

4. The semiconductor circuit of claim 1 wherein the semiconductor substrate comprises a buried layer.

5. The semiconductor circuit of claim 1 wherein the semiconductor substrate comprises an epitaxy silicon layer over silicon germanium layer.

6. The semiconductor circuit of claim 1 wherein the semiconductor device include an N-MOS transistor.

7. The semiconductor circuit of claim 1 wherein the semiconductor device includes an P-MOS transistor.

8. The semiconductor circuit of claim 1 wherein the semiconductor device is part of a circuit fir an input/output circuit.

9. The semiconductor circuit of claim 1 wherein the semiconductor device further comprises a gate disposed on the semiconductor substrate between the source region and the first drain region.

10. The semiconductor circuit of claim 9 wherein the gate comprises a gate dielectric and a gate electrode.

11. The semiconductor circuit of claim 10 wherein the gate dielectric comprises a material selected from the group consisting of silicon oxide, silicon nitride, silicon oxynitride, a high k dielectric, and a combination thereof.

12. The semiconductor circuit of claim 11 wherein the high k material comprises hafnium oxide, zirconium oxide, aluminum oxide, a hafnium dioxide-alumina alloy, or a combination thereof.

13. The semiconductor circuit of claim 10 wherein the gate electrode includes at least one conductive material.

14. The semiconductor circuit of claim 10 wherein the gate electrode contains at least one of silicon, germanium, and metal.

15. The semiconductor circuit of claim 10 wherein the gate electrode comprises a material selected from the group consisting of poly-Si, poly-SiGe, metal, metal suicide, metal nitride, metal oxide, and a combination thereof.

16. The semiconductor circuit of claim 9 wherein the source and the first drain regions comprise lightly doped drain (LDD) regions and heavy doped regions.

17. The semiconductor circuit of claim 9 further comprising at least one additional reverse doped region disposed laterally adjacent to the second drain region on a side of the second drain region opposite from the first drain region.

18. The semiconductor circuit of claim 17 wherein the first drain region is n-type and the reverse doped region is p-type.

19. The semiconductor circuit of claim 17 wherein the first drain region is p-type ad the reverse doped region is n-type.

20. The semiconductor circuit of claim 1 wherein the second drain region is coupled to an input/output pad and laterally contacts the reverse doped region.

21. A method to form a semiconductor circuit, comprising:
providing a semiconductor wafer having an n-doped substrate and a p-doped substrate, wherein each substrate has a plurality of gates;
forming in the p-doped substrate an N-channel metal-oxide-semiconduetor (NMOS) transistor having a first source region, a first drain region, and an N-channel region interposed between the first source region and the first drain region;
forming a p-type reverse doped region laterally adjacent and laterally contacting the first drain region on a aide of the first drain region opposite from the N-channel region, wherein the p-type reverse doped region baa an opposite doping type from that of the first drain region, has a type dopant concentration higher than that of the p-type substrate, and is electrically floating, the p-type reverse doped region and the first drain region forming a first p-n junction;
forming in the n-doped substrate a P-channel metal-oxide-semiconductor (PMOS) transistor having a second source region, a second drain region, and a P-channel region interposed between the second source region and the second drain region; and
forming an n-type reverse doped region laterally adjacent and laterally contacting the second drain region on a side of the second drain region opposite from the P-channel region, wherein the n-type reverse doped region has an opposite doping type from that of the second drain region, has an n-type dopant concentration higher than that of the n-type substrate, and is electrically floating, the n-type reverse doped region and the second drain region forming a second p-n junction.

22. A method to form a semiconductor circuit, comprising:
providing a semiconductor wafer having an n-doped substrate and a p-doped substrate, wherein each substrate has a plurality of gates;
forming at least one p-type reverse doped region laterally adjacent and laterally contacting a drain region of an N-channel metal-oxide semiconductor (NMOS) transistor in the p-doped substrate, wherein the p-type reverse doped region has an opposite doping type from that of the drain region of the NMOS transistor, has a p-type dopant concentration higher than that of the p-type substrate, and is electrically floating, the p-type reverse doped region and the drain region of the NMOS transistor forming a first p-n junction; and
forming at least one n-typo reverse doped region laterally adjacent and laterally contacting a drain region of a P-channel metal-oxide semiconductor (PMOS) transistor in the n-doped substrate, wherein the n-type reverse doped region has an opposite doping type from that of the drain region of the PMOS transistor, has an n-type dopant concentration higher than that of the n-type substrate, and is electrically floating the n-type reverse doped region and the drain region of the PMOS forming a second p-n junction;
wherein forming at least one p-type reverse doped region comprises simultaneously forming p-type doping in the n-type substrate to form the drain of the PMOS transistor.

23. A method to form a semiconductor circuit, comprising:
providing a semiconductor wafer having an n-doped substrate and a p-doped substrate, wherein each substrate has a plurality of gates;
forming at least one p-type reverse doped region laterally adjacent and laterally contacting a drain region of an N-channel metal-oxide semiconductor (NMOS) transistor in the p-doped substrate, wherein the p-type reverse doped region has an opposite doping type from that of the drain region of the NMOS transistor, has a p-type dopant concentration higher than that of the p-type substrate, and is electrically floating, the p-type reverse doped region and the drain region of the NMOS transistor forming a first p-n junction; and
forming at least one n-type reverse doped region laterally adjacent and laterally contacting a drain region of a P-channel metal-oxide semiconductor (PMOS) transistor in the n-doped substrate, wherein the n-type reverse doped region has an opposite doping type from that of the drain region of the PMOS transistor, has mi n-type dopant concentration higher than that of the n-type substrate, and is electrically floating, the n-type reverse doped region and the drain region of the PMOS forming a second p-n junction;

wherein Conning at least one n-type reverse doped region comprises simultaneously forming n-type doping in the p-type substrate to form the drain of the NMOS transistor.

24. A method to form a semiconductor circuit, comprising:

providing a semiconductor wafer having an n-doped substrate and a p-doped substrate, wherein each substrate has a plurality of gates;

forming at least one p-type reverse doped region laterally adjacent and laterally contacting a drain region of an N-channel metal-oxide semiconductor (NMOS) transistor in the p-doped substrate, wherein the p-type reverse doped region has an opposite doping type from that of the drain region of the NMOS transistor, has a p-type dopant concentration higher than that of the p-type substrate, and is electrically floating, the p-type reverse doped region and the drain region of the NMOS transistor forming a first p-n junction; and forming at least one n-type reverse doped region laterally adjacent and laterally contacting a drain region of a P-channel metal-oxide semiconductor (PMOS) transistor in the n-doped substrate, wherein the n-type reverse doped region has an opposite doping type from that of the drain region of the PMOS transistor, has an n-type dopant concentration higher than that of the n-type substrate, and is electrically floating, the n-type reverse doped region and the drain region of the PMOS forming a second p-n junction; wherein:

forming at least one p-type reverse doped region comprises simultaneously forming p-type doping in the n-type substrate to form a light doped drain (LDD) region of the drain of the PMOS transistor; and forming at least one n-type reverse doped region comprises simultaneously forming n-type doping in the p-type substrate to form a LDD region of the drain of the NMOS transistor.

25. The method of claim 24 wherein forming n-type doping and forming p-type doping have a dopant dose ranging between about $1\times10^{13}$ cm$^{-2}$ and about $8\times10^{14}$ cm$^{-2}$.

26. The method of claim 24 further comprising:

forming spacers located on both sides of the gate; and providing heavy source and drain doping regions having a dopant concentration higher than that of the LDD regon.

27. The method of claim 26 wherein providing heavy source and drain doping regions comprises providing a dopant dose ranging between about $10^{13}$ cm$^{-2}$ and about $10^{16}$ cm$^{-2}$.

28. The method of claim 21 wherein providing n-type doping is by ion implantation processing and phosphorous dopant.

29. The method of claim 21 wherein providing p-type doping is by ion implantation processing and boron dopant.

30. The method of claim 21 wherein the n-type substrate is a n-well structure timed on the semiconductor wafer.

31. The method of claim 22 wherein the p-type substrate is a p-well structure formed on the semiconductor wafer.

32. A semiconductor circuit, comprising:

a semiconductor substrate having isolation features;

first and second metal-oxide-semiconductor (MOS) transistors formed on the semiconductor substrate, each having a source region, a drain region end a channel region formed in the semiconductor substrate, with the channel region disposed between the source region and the drain region, and a gate disposed over the channel region between the source region and the drain region; and a reverse doped region disposed between the drain region of the first MOS transistor and the drain region of the second MOS transistor, laterally adjacent and laterally contacting each drain region, the reverse doped region having an opposite doping type from that of the drain regions, having a dopant concentration higher than that of the semiconductor substrate, and being electrically floating, and the reverse doped region forming a respective p-n junction with each of the drain regions.

33. The semiconductor circuit of claim 32 wherein the MOS transistors include an N-channel MOS transistot.

34. The semiconductor circuit of claim 32 wherein the MOS transistors include a P-channel MOS transistor.

35. A semiconductor circuit, comprising:

a semiconductor substrate having isolation features; and a plurality of metal-oxide-semiconductor (MOS) transistors formed on the semiconductor substrate, each having a gate disposed between a source region and a drain region, wherein the drain region is laterally adjacent and laterally contacts a reverse doped region having an opposite doping type from that of the drain region, having a dopant concentration higher than that of the semiconductor substrate, and being electrically floating, and the reverse doped region and the drain region forming a p-n junction;

wherein among three doped drain regions are alternatively located two reverse doped regions between two proximate gates.

36. The semiconductor circuit of claim 32 wherein the second MOS transistor further comprises an additional drain, and including a further reverse doped region that is interposed between and laterally contacts each of the drain regions of the second MOS transistor.

37. The semiconductor circuit of claim 32 further comprising conductive features coupled between each of the drain regions and a respective input/output pad.

38. The semiconductor circuit of claim 32 wherein the isolation features comprise shallow trench isolation (STI) structure.

39. The semiconductor circuit of claim 32 wherein the semiconductor substrate comprises silicon.

40. The semiconductor circuit of claim 32 wherein each of the gates comprises a gate dielectric and a gate electrode.

41. The semiconductor circuit of claim 32 wherein the source and drain regions of each of the transistors comprise lightly doped drain (LDD) regions and heavy doped regions.

42. The semiconductor circuit of claim 32 further comprising a body contact having same type of dopant as that of the substrate and higher doping concentration than that of the substrate.

43. The semiconductor circuit of claim 32 further comprising multilevel interconnects formed by a plurality of conductive materials and coupled to the MOS transistors; and wherein the p-n junction between the reverse doped region and the drain region in each of the transistors has a lower reverse breakdown voltage than that of a p-n junction between the drain region and the semiconductor substrate to enhance electrostatic discharge (ESD) protection.

44. The semiconductor circuit of claim 1, wherein the p-n junction has a lower reverse breakdown voltage than that of a p-n junction between the first drain region and the semiconductor substrate to enhance electrostatic discharge protection.

* * * * *